United States Patent [19]
Barnes et al.

[11] Patent Number: 6,114,626
[45] Date of Patent: Sep. 5, 2000

[54] TOOL-LESS CIRCUIT BOARD MOUNTING SYSTEM

[75] Inventors: John Barnes, University Place; Thomas Holden, Tumwater; Merrill George, Lacey, all of Wash.

[73] Assignee: Intel Corporation, Santa Clara, Calif.

[21] Appl. No.: 09/062,267

[22] Filed: Apr. 17, 1998

[51] Int. Cl.[7] .................................................... H05K 7/14
[52] U.S. Cl. ...................... 174/52.1; 361/801; 361/802; 361/758; 361/760
[58] Field of Search .................... 174/52.1, 51; 361/753, 361/756, 759, 760, 758, 799, 801, 802

[56] References Cited

U.S. PATENT DOCUMENTS

| | | | |
|---|---|---|---|
| 3,878,438 | 4/1975 | Weisman | 317/101 DH |
| 5,398,164 | 3/1995 | Goodman et al. | 361/752 |
| 5,432,682 | 7/1995 | Giehl et al. | 361/796 |
| 5,467,254 | 11/1995 | Brusati et al. | 361/799 |
| 5,618,129 | 4/1997 | Skarivoda | 403/389 |
| 5,642,263 | 6/1997 | Lauruhn | 361/801 |
| 5,691,504 | 11/1997 | Sands et al. | 174/35 R |
| 5,805,429 | 9/1998 | Andersson | 361/799 |
| 5,934,916 | 8/1999 | Latal et al. | 439/95 |
| 5,953,217 | 9/1999 | Klein et al. | 361/799 |

OTHER PUBLICATIONS

Intel Corporation, "NLX Motherboard Specification", Release 1.2, Mar., 1997.
Intel Corporation, "NLX Rail Design Suggestions", Version 1.0, May, 1997.
Intel Corporation, "NLX Ground Clip Design Suggestions", Version 1.0, May, 1997.

*Primary Examiner*—Kristine Kincaid
*Assistant Examiner*—W. David Walkenhorst
*Attorney, Agent, or Firm*—Trop, Pruner & Hu, P.C.

[57] ABSTRACT

An assembly for attaching a printed circuit board to a chassis includes a mounting rail for engagement with the printed circuit board and a guide member for engagement with the chassis. In one embodiment, the mounting rail includes an elongated body member having a first side and a second side and a spacer formed in the first side. A lock member for engaging the printed circuit board is coupled to the spacer. The guide member defines a guide slot for slidably receiving the mounting rail.

19 Claims, 7 Drawing Sheets

TOOL-LESS CIRCUIT BOARD MOUNTING SYSTEM

BACKGROUND

The invention relates generally to computers and other electronic assemblies comprising printed circuit boards and, more particularly, to an apparatus for securing a motherboard within a computer.

A computer system includes a motherboard enclosed within a chassis. The motherboard provides a surface on which much of the computer's critical circuitry is mounted such as the control processing unit and system memory. Because of the critical circuitry contained in the motherboard, it is important to properly secure the motherboard within the chassis of the computer to ensure the dynamic and static stability of the motherboard.

Motherboards are typically secured within the chassis by several screws which extend through holes in the motherboard and engage threaded portions in the chassis. Sometimes, a single screw or plastic plug is used to secure the motherboard to the chassis. However, this single attachment point between the motherboard and the chassis makes the motherboard vulnerable to chassis vibrations.

Prior to mounting the motherboard within the chassis, the holes in the motherboard are aligned with the threaded portions in the chassis. Screws are then inserted into the holes in the motherboard and threaded into the threaded portions in the chassis. Tools, such as pneumatic, electric, or hand screw drivers are typically used to drive the screws into the threaded portions in the chassis. Installing the motherboard with a tool often means that subsequent access to the motherboard is deterred if the appropriate tool is unavailable.

In a manufacturing facility where an assembly line worker installs a large number of motherboards in a given day, workers may develop cumulative trauma disorder, e.g. carpel tunnel syndrome, due to repeated operation of the tool. Often, the tool may slip while installing the motherboard and cause damage to the motherboard. The pressure applied to the motherboard while operating the tool may also damage the motherboard. Thus, it would be beneficial to have a board-to-chassis connection system that does not require a tool.

SUMMARY

In general, in one aspect, a mounting rail for a printed circuit board comprises an elongated body member having a first side and a second side and a spacer formed on the first side. A lock member for engagement with the printed circuit board is coupled to the spacer.

In another aspect, an assembly for attaching a printed circuit board to a chassis comprises a mounting rail for engagement with the printed circuit board. The mounting rail comprises an elongated body member having a first side and a second side and a spacer formed on the first side. A lock member for engaging the printed circuit board is coupled to the spacer. A guide member for engagement with the chassis defines a guide slot for slidably receiving the mounting rail.

Other features of the invention will be apparent from the following description and the appended claims.

DETAILED DESCRIPTION

The following embodiments are illustrative only and are not to be considered limiting in any respect.

Figure 1:
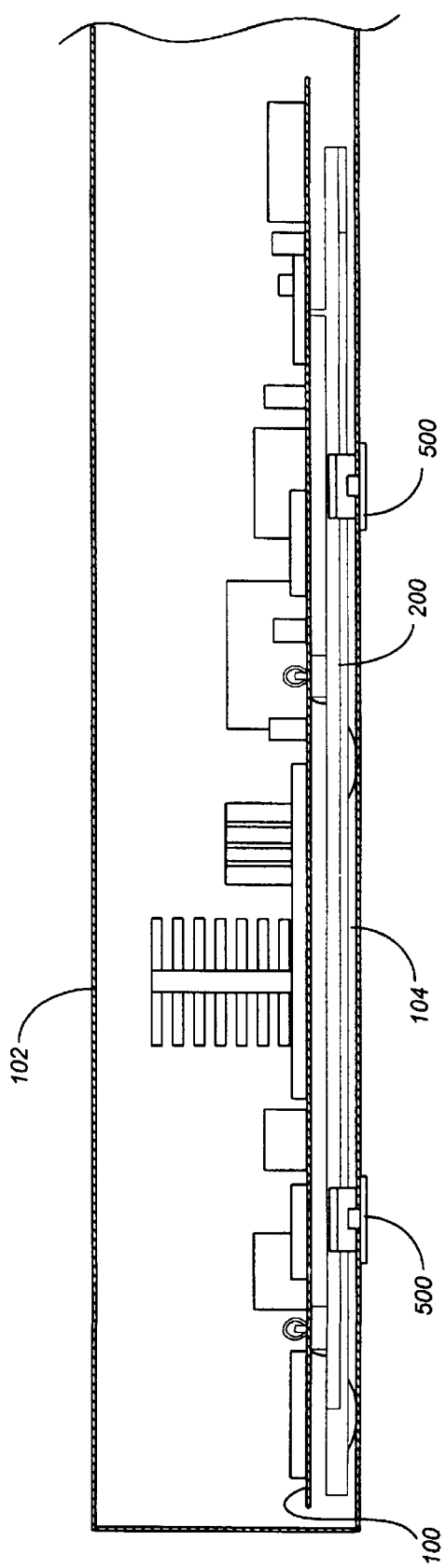
FIG. 1 is a schematic of a PC board coupled to a chassis by a rail assembly.

Referring to FIG. 1, a motherboard 100 is attached to a chassis 102 by a rail assembly 104. The rail assembly 104 includes a mounting rail 200 and rail guides 500.

Figure 2:
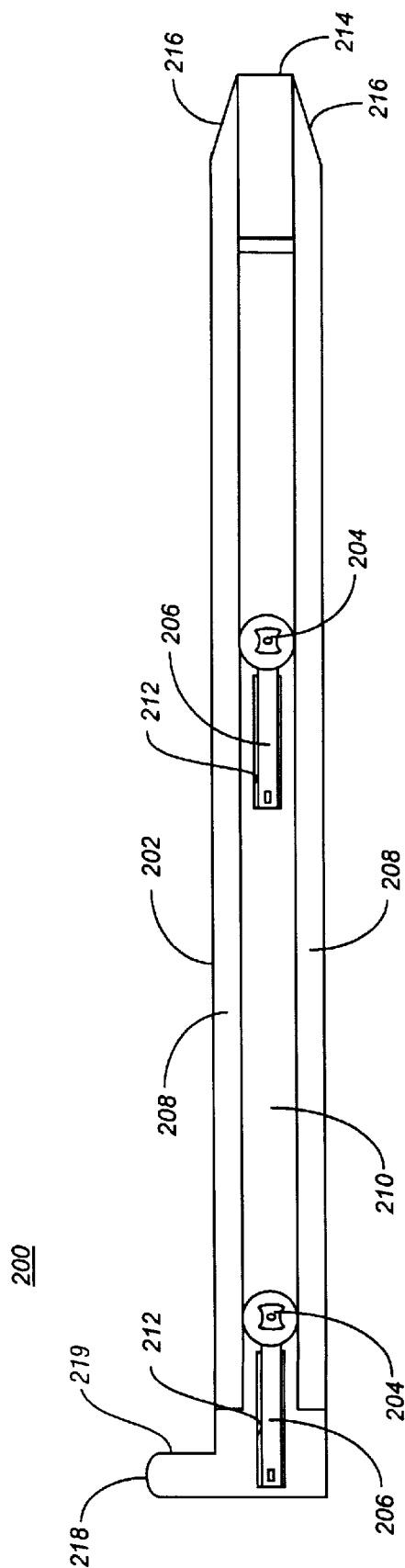
FIG. 2 is a top view of a mounting rail.

Referring now to FIG. 2, the mounting rail 200 includes an elongated body 202, lock members, e.g. fasteners 204, and grounding strips 206. The body 202 includes a pair of flat surfaces 208 which are disposed on opposite sides of a ridge 210. The ridge 210 includes a pair of slots 212 which receive the grounding strips 206. The leading edge 214 of the body 202 includes tapered portions 216 and the trailing edge 218 of the body 202 includes an arm 219. The body 202 may be injection molded from a plastic resin, e.g. nylon, or from a thermoplastic alloy, e.g. polycarbonate, acrylonytrile, butadiene, and stryrene. The grounding strips 206 may be made of Beryllium Copper.

Figure 3:
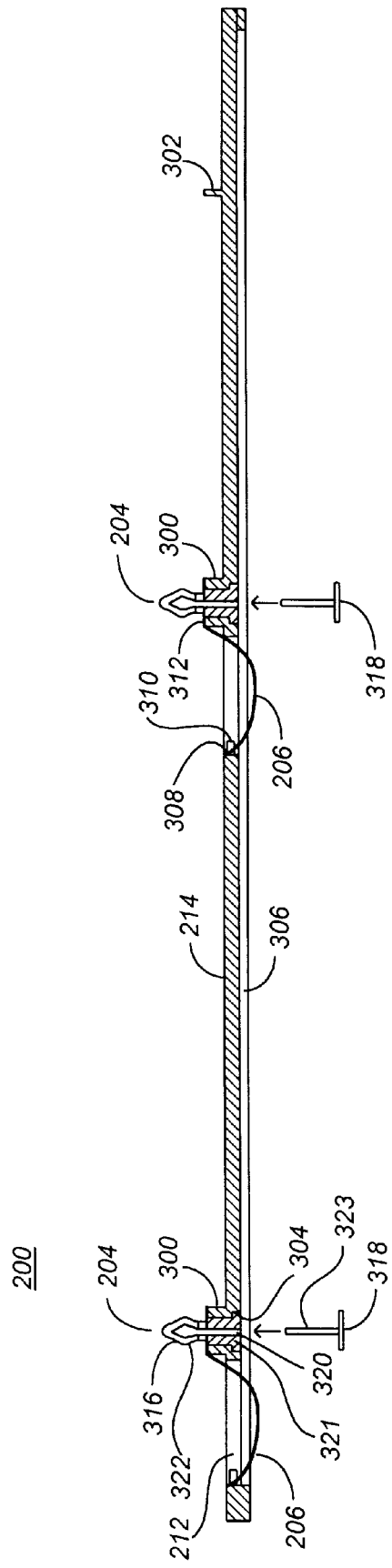
FIG. 3 is a partial cross-section view of the mounting rail shown in FIG. 2.

Referring to FIG. 3, a pair of spacers 300 and spacer 302 are formed on the ridge 214. Apertures 304 extend through the spacers 300 and ridge 214 and open into a groove 306 beneath the ridge 214. The grounding strips 206 extend through the slots 212 and groove 306 and project from the bottom surface of the body 202. The first ends 308 of the grounding strips 206 include apertures which engage tabs 310 at a side of the walls defining the slots 212. The second ends 312 of the grounding strips 206 are mounted on the spacers 300 and include apertures which fit around a neck region of the fasteners 204.

The fasteners 204 are two-piece rivets which include clip members 316 and pin members 318. The clip members 316 and pin members 318 may be made of a plastic, e.g. nylon. The lower ends 321 of the clip members 316 are ultrasonically welded to the spacers 300 while the upper ends of the clip members protrude above the spacers 300. Instead of welding the lower ends 321 to the spacers, the clip members 316 may be integrally formed or molded with the body 202 or spacers 300. The clip members 316 have apertures 320 which are arranged to receive stem portions 323 of the pin members 318. Although the fasteners 204 are illustrated as two-piece rivets, it should be clear that the fasteners 204 may also be single-piece rivets.

Figure 4:
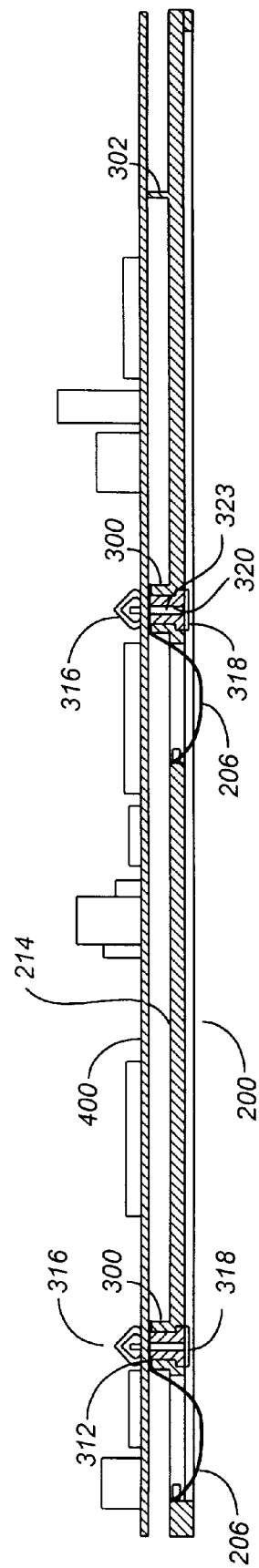
FIG. 4 shows the mounting rail attached to a PC board.

Referring to FIG. 4, the mounting rail 200 is attached to the underside of a motherboard 400 by inserting the clip members 316 into pre-drilled holes in the motherboard 400. The stem portions 323 of the pin members 318 are then inserted into the apertures 320 to engage the clip members 316. When the stem portions 323 engage the clip members 316, the walls of the clip members 316 are expanded to tightly engage the motherboard 400. Thus, the mounting rail 200 is attached to the underside of the motherboard 400 without the use of a tool.

The second ends 312 of the grounding strips 206 make contact with the motherboard 400 when the mounting rail 200 is secured to the motherboard. The spacers 300 and 302 provide a desired spacing between the underside of the motherboard 400 and the ridge 214.

Figure 5:
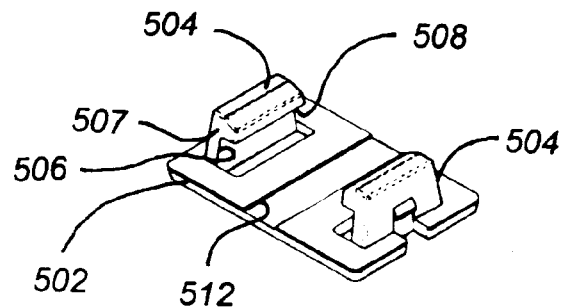
FIG. 5 is a perspective view of a rail guide.

Referring to FIG. 5, the rail guide 500 includes a base portion 502 and a pair of opposing hook members 504 extending upwardly from the base portion 502. A guide slot 506 is defined by the hook members 504. The guide slot 506 is arranged to receive the mounting rail 200 (shown in FIG. 2). The hook members 504 include arm portions 507 and catch portions 508. The catch portions 508 are arranged to slide on the flat surfaces 210 (shown in FIG. 2) on the body 202 of the mounting rail 200. The hook members 504 include tabs 510 which snap to a chassis (not shown) to secure the rail guide 500 in place.

A relief groove 512 is provided on the base portion 502. The relief groove 512 provides flexing ability to the base portion 502 and functions as a loaded spring which biases the hook members 504 inward toward each other. The rail guide 500 may be made of a plastic, e.g. nylon, or a thermoplastic alloy, e.g. polycarbonate.

Figure 6:
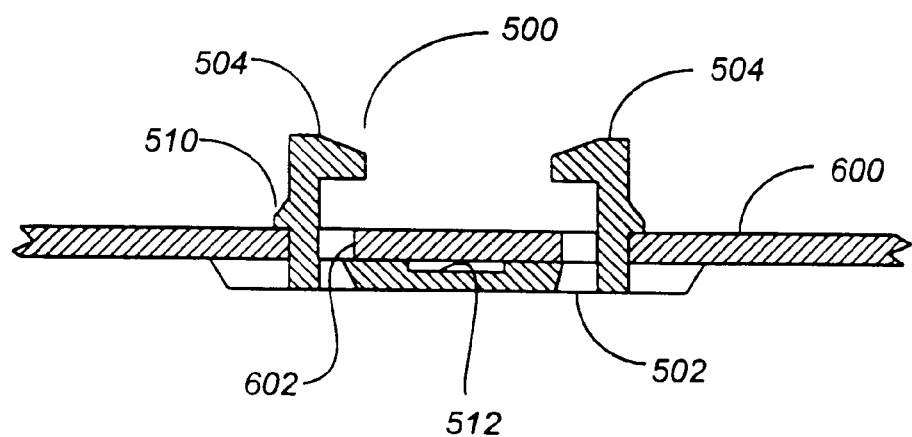
FIG. 6 shows the rail guide attached to a chassis.

Referring to FIG. 6, the rail guide 500 is attached to a chassis 600 by inserting the hook members 504 into slots 602 in the chassis. The tabs 510 snap onto the chassis 600 and lock the rail guide 500 in place.

Figure 7:
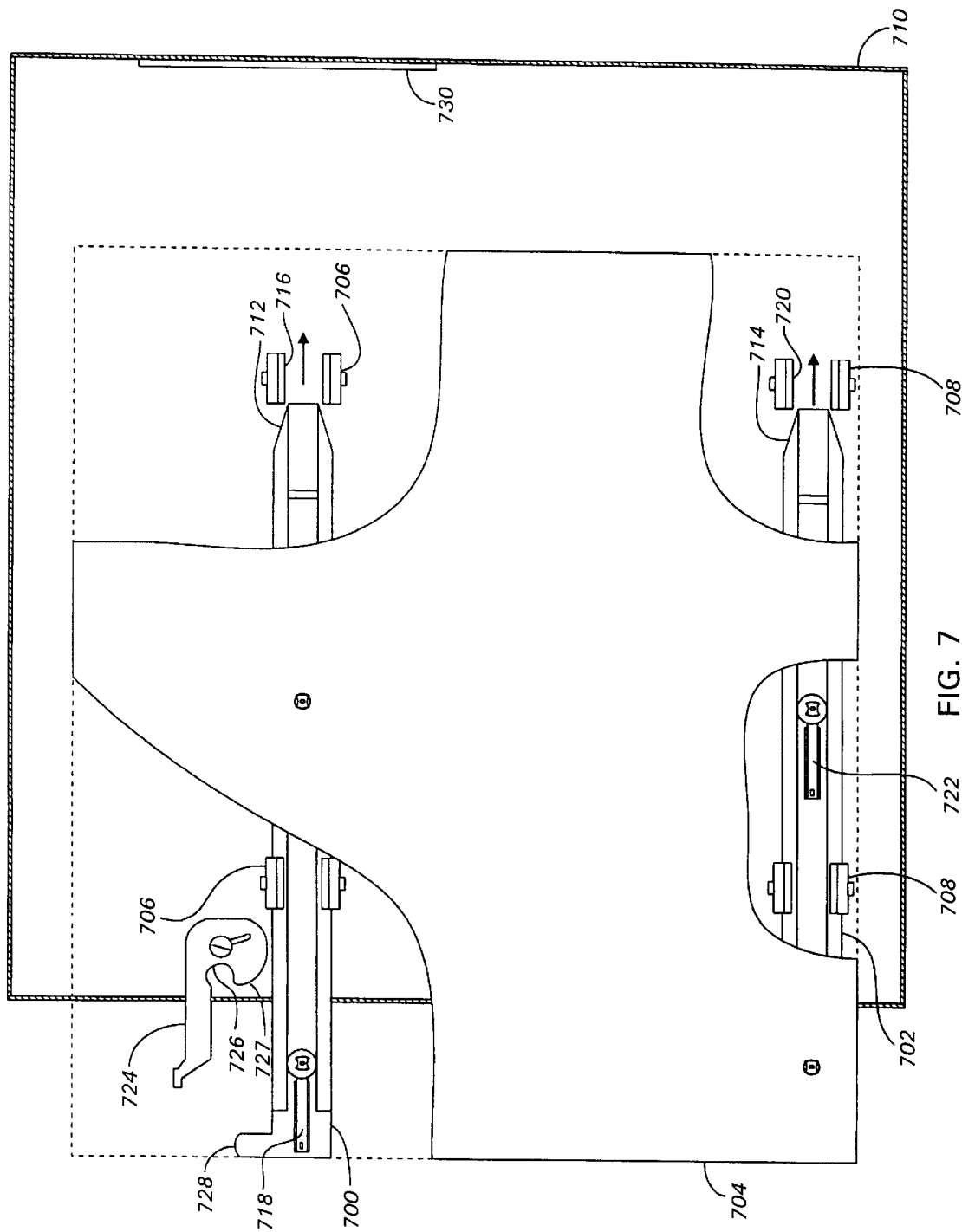
FIG. 7 shows how a motherboard is secured within a chassis.

Referring now to FIG. 7, mounting rails 700 and 702 are secured to the underside of a motherboard 704. The mounting rails 700 and 702 are similar to the mounting rail 200 and are secured to the motherboard 704 in the manner previously described. A pair of rail guides 706 and a pair of rail guides 708 are secured to a chassis 710. The rail guides 706 and 708 are similar to the rail guide 500 and are attached to the chassis 710 in the manner previously described.

The rail guides 706 are aligned to receive the mounting rail 700 and the rail guides 708 are aligned to receive the mounting rail 702. The motherboard 704 is attached to the chassis 710 by sliding the mounting rails 700 and 702 into the guide slots of the rail guides 706 and 708, respectively. The tapered leading edges 712 and 714 of the mounting rails 700 and 702 allow ease of entry of the mounting rails into the guide slots of the rail guides.

The hook members 716 and the relief grooves (not shown) of the rail guides 706 bias the ground strips 718 on the mounting rail 700 against the chassis 710 to ensure good electrical contact between the chassis and the motherboard. Similarly, the hook members 720 and the relief grooves (not shown) of the rail guides 708 bias the ground strips 722 on the mounting rail 702 against the chassis 710.

A lever 724 is pivotally mounted on the chassis 710. The lever 724 includes a groove 726 which is arranged to receive the arm 728 of the mounting rail 700. The lever 724 includes arcuate surface 727 which co-act with the mounting rail 700 to urge the arm 728 into the groove 726.

Figure 8:
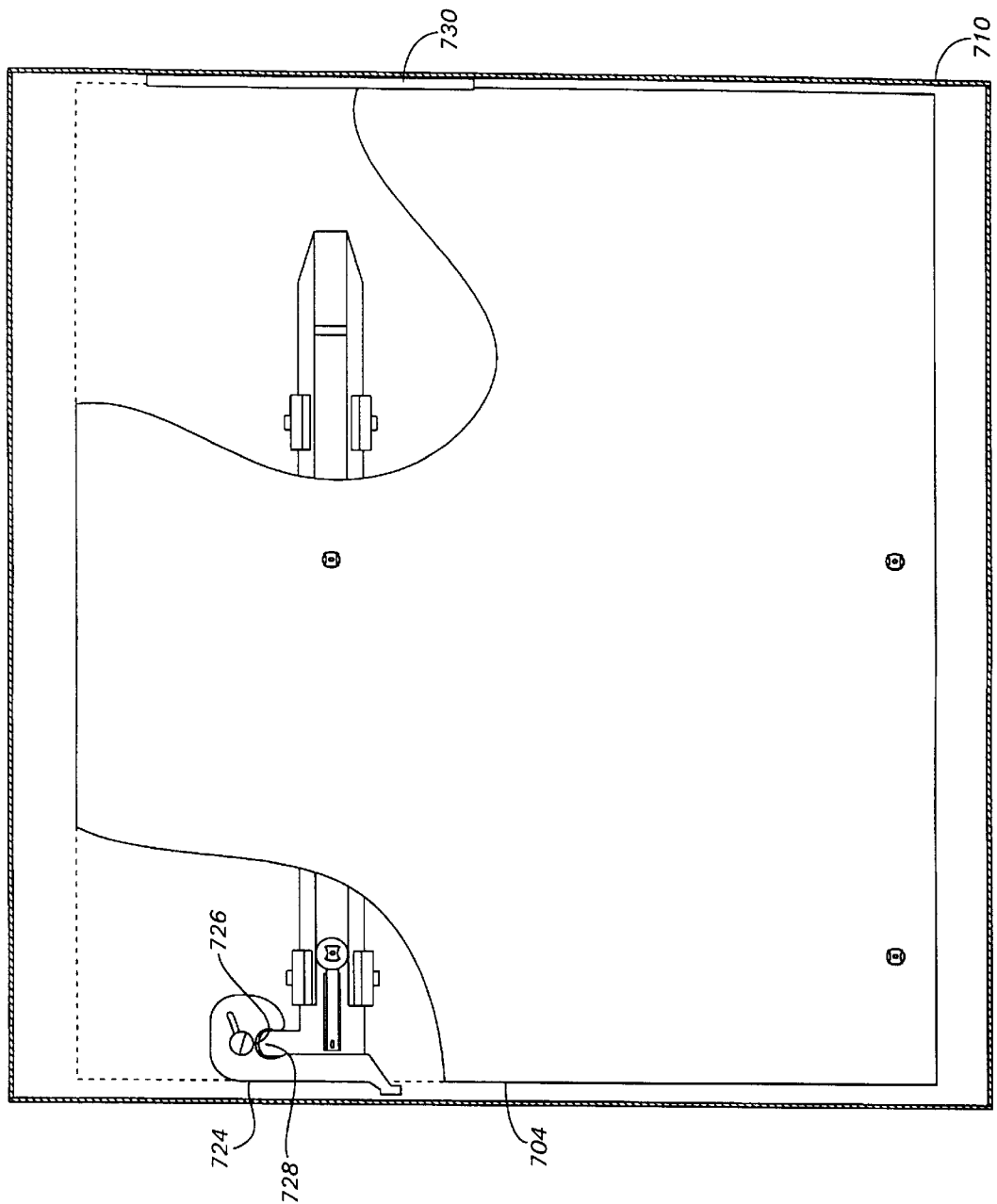
FIG. 8 shows a motherboard secured within a chassis.

Referring to FIG. 8, the motherboard is urged inwardly to mate with a motherboard connector 730 in the chassis 710 when the lever 724 is pivoted such that the arm 728 slides into the groove 726. The motherboard 704 may be released from the motherboard connector 730 when the lever 724 is swung such that the arm 728 is disengaged from the groove 726.

While the invention has been described with respect to a limited number of exemplary embodiments, those skilled in the art will appreciate numerous modifications and variations therefrom. For instance, the mounting rail may be mounted on a circuit board other than a motherboard. The rail guide may be an integral part of the chassis. The mounting rail and rail guides may be made of other materials besides a plastic resin and thermoplastic alloy.

What is claimed is:

1. A mounting rail for a printed circuit board, comprising:
   an elongated body member having a first side and a second side and a spacer formed on the first side; and
   a lock member coupled to the spacer for engagement with the printed circuit board.

2. The mounting rail of claim 1, further comprising a grounding element forming an electrically conductive path between the printed circuit board and a chassis.

3. The mounting rail of claim 2, wherein the lock member comprises:
   a clip member having a lower portion attached to the spacer and an upper portion projecting from the spacer, the upper portion being insertable into a hole in the printed circuit board; and
   a pin member having a stem portion insertable into the clip member to engage the clip member and expand the upper portion of the clip member to engage the printed circuit board.

4. The mounting rail of claim 2, wherein the grounding element includes:
   an intermediate portion extending through a slot in the body member and projecting from the second side of the body member; and
   an end portion mounted on a surface of the spacer such that contact is established between the grounding element and the printed circuit board when the lock member engages the printed circuit board.

5. The mounting rail of claim 2, wherein the grounding element is made of beryllium copper.

6. The mounting rail of claim 1, wherein the body member and lock member are made of nylon.

7. An assembly for attaching a printed circuit board to a chassis, comprising:
   a mounting rail for engagement with the printed circuit board, the mounting rail comprising:
      an elongated body member having a first side and a second side and a spacer formed on the first side; and
      a lock member coupled to the spacer, the lock member for engaging the printed circuit board; and
   a guide member for engagement with the chassis, the guide member defining a guide slot for slidably receiving the mounting rail.

8. The assembly of claim 7, wherein the mounting rail further comprises a grounding element forming an electrically conductive path between the printed circuit board and the chassis.

9. The assembly of claim 7, wherein the lock member comprises:
   a clip member having a lower portion coupled to the spacer and an upper portion projecting from the spacer, the upper portion for insertion into a hole in the printed circuit board; and
   a pin member having a stem portion insertable into the clip member to engage the clip member and expand the upper portion of the clip member to engage the printed circuit board.

10. The assembly of claim 7, further comprising a lever pivotally attachable to the chassis, the lever having a groove for engagement with an arm portion on a trailing edge of the body member.

11. The assembly of claim 7, wherein the guide member includes a base portion and a pair of opposed hook members projecting from the base portion and wherein the hook members define the guide slot.

12. The assembly of claim 11, wherein the hook members include tabs for engaging the chassis.

13. The assembly of claim 11, wherein the first side of the body member includes a pair of flat surfaces extending along the body member and wherein the hook members ride on the flat surfaces as the body member slides through the guide slot.

14. The assembly of claim 11, wherein the base portion includes a groove disposed between the hook members and wherein the groove biases the hook members toward each other.

15. The assembly of claim 7, wherein a plurality of spacers are formed on the first side of the body member and lock members are coupled to at least two of the spacers.

16. The assembly of claim 7, wherein a plurality of guide members are coupled to the chassis and aligned to define a guide channel for slidably receiving the body member.

17. The assembly of claim 7, wherein the body member includes tapered portions on one end.

18. An assembly for attaching a printed circuit board to a chassis, comprising:
- an elongated body member having a first side and a second side and a spacer formed on the first side;
- a lock member coupled to the spacer, the lock member for engaging the printed circuit board;
- a grounding element forming an electrically conductive path between the printed circuit board and the chassis; and
- a guide member having a base portion and a pair of hook members projecting from the base portion, the hook members having tabs for engaging the chassis, the hook members defining a guide slot for receiving the body member.

19. A computing system, comprising:

a printed circuit board;

a chassis; and an assembly for attaching the printed circuit board to the chassis, comprising:
- an elongated body member having a first side and a second side and a spacer formed on the first side;
- a lock member coupled to the spacer, the lock member for engaging the printed circuit board;
- a grounding element forming an electrically conductive path between the printed circuit board and the chassis; and
- a guide member having a base portion and a pair of hook members projecting from the base portion, the hook members having tabs for engaging the chassis, the hook members defining a guide slot for receiving the body member.

* * * * *